United States Patent
Somayajula

(10) Patent No.: US 7,209,061 B2
(45) Date of Patent: Apr. 24, 2007

(54) METHOD AND SYSTEM FOR SAMPLING A SIGNAL

(75) Inventor: Shyam S. Somayajula, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 0 days.

(21) Appl. No.: 11/094,613

(22) Filed: Mar. 30, 2005

(65) Prior Publication Data

US 2006/0227019 A1 Oct. 12, 2006

(51) Int. Cl.
*H03M 1/00* (2006.01)

(52) U.S. Cl. ........................ 341/122; 341/155; 375/355

(58) Field of Classification Search ................ 341/122, 341/143, 155
See application file for complete search history.

(56) References Cited

U.S. PATENT DOCUMENTS

| | | | |
|---|---|---|---|
| 4,188,583 A | 2/1980 | McCurdy | |
| 4,384,361 A | 5/1983 | Masaki | |
| 4,602,243 A | 7/1986 | Von Bargen et al. | |
| 4,694,244 A * | 9/1987 | Whiteside et al. | 341/122 |
| 4,768,017 A * | 8/1988 | Gordon | 341/122 |
| 4,805,165 A | 2/1989 | Kawamura et al. | |
| 4,870,699 A | 9/1989 | Garner et al. | |
| 4,879,758 A | 11/1989 | DeLuca et al. | |
| 4,930,126 A | 5/1990 | Kazecki et al. | |
| 4,996,639 A | 2/1991 | Ishimoto et al. | |
| 5,031,233 A | 7/1991 | Ragan | |
| 5,058,203 A | 10/1991 | Inagami | |
| 5,142,699 A | 8/1992 | Sato et al. | |
| 5,150,361 A | 9/1992 | Wieczorek et al. | |
| 5,151,769 A | 9/1992 | Immorlica, Jr. et al. | |
| 5,241,541 A | 8/1993 | Farrell et al. | |

(Continued)

FOREIGN PATENT DOCUMENTS

EP 0447302 A1 9/1991

(Continued)

OTHER PUBLICATIONS

Mehta, Jesal L., "Transceiver architectures for wireless ICs," RF Designs, www.rfdesign.com, Feb. 2001, pp. 76-96.

(Continued)

*Primary Examiner*—Khai M. Nguyen
(74) *Attorney, Agent, or Firm*—Meyertons Hood Kivlin Kowert & Goetzel, P.C.; B. Noël Kivlin; Stephen J. Curran

(57) ABSTRACT

A system includes a digital circuit that may be clocked by a digital clock signal having an associated clock period. The system also includes a sample clock generation circuit coupled to a sampling circuit. The sample clock generation circuit may be configured to receive an input clock having a fixed phase relationship with respect to the digital clock signal. The sample clock generation circuit may also generate a sample clock having a first sampling edge corresponding to a first relative offset within the clock period and a subsequent sampling edge corresponding to a different relative offset within the clock period. The sampling circuit may be configured to sample a designated signal upon a first sampling instance corresponding to the first sampling edge and to sample the designated signal upon a subsequent sampling instance corresponding to the subsequent sampling edge.

25 Claims, 7 Drawing Sheets

U.S. PATENT DOCUMENTS

| | | | |
|---|---|---|---|
| 5,280,644 A | 1/1994 | Vannatta et al. | |
| 5,307,066 A | 4/1994 | Kobayashi et al. | |
| 5,355,524 A | 10/1994 | Higgins, Jr. | |
| 5,404,547 A | 4/1995 | Diamantstein | |
| 5,448,755 A | 9/1995 | Tanaka | |
| 5,471,471 A | 11/1995 | Freeburg et al. | |
| 5,471,663 A | 11/1995 | Davis | |
| 5,475,684 A | 12/1995 | Shimizu | |
| 5,519,711 A | 5/1996 | Sointula | |
| 5,586,149 A * | 12/1996 | Connell et al. | 375/346 |
| 5,604,928 A | 2/1997 | Hamano et al. | |
| 5,630,224 A | 5/1997 | Swail | |
| 5,649,160 A | 7/1997 | Corry et al. | |
| 5,731,728 A * | 3/1998 | Greiss | 327/299 |
| 5,758,278 A | 5/1998 | Lansdowne | |
| 5,764,693 A | 6/1998 | Taylor et al. | |
| 5,812,936 A | 9/1998 | DeMont | |
| 5,838,741 A | 11/1998 | Callaway, Jr. et al. | |
| 5,841,814 A | 11/1998 | Cupo | |
| 5,842,037 A | 11/1998 | Haartsen | |
| 5,872,540 A | 2/1999 | Casabona et al. | |
| 5,875,449 A | 2/1999 | Ono | |
| 5,917,854 A | 6/1999 | Taylor et al. | |
| 5,920,592 A | 7/1999 | Tanaka et al. | |
| 5,923,761 A | 7/1999 | Lodenius | |
| 5,953,640 A | 9/1999 | Meador et al. | |
| 5,963,604 A * | 10/1999 | Greiss | 375/355 |
| 5,963,885 A | 10/1999 | Macq | |
| 6,020,614 A | 2/2000 | Worley | |
| 6,166,595 A * | 12/2000 | Moldsvar et al. | 330/9 |
| 6,243,597 B1 | 6/2001 | Daanen | |
| 6,246,335 B1 | 6/2001 | Tsunoda | |
| 6,252,441 B1 | 6/2001 | Lee et al. | |
| 6,300,889 B1 * | 10/2001 | Piasecki | 341/122 |
| 6,310,570 B1 | 10/2001 | Rumreich | |
| 6,366,622 B1 | 4/2002 | Brown et al. | |
| 6,420,989 B1 * | 7/2002 | Herbold | 341/155 |
| 6,480,553 B1 | 11/2002 | Ho et al. | |
| 6,498,819 B1 | 12/2002 | Martin | |
| 6,510,185 B2 | 1/2003 | Lee et al. | |
| 6,737,904 B1 * | 5/2004 | Butaud et al. | 327/298 |
| 6,963,626 B1 * | 11/2005 | Shaeffer et al. | 375/346 |
| 7,046,183 B2 * | 5/2006 | Bilinskis et al. | 341/155 |
| 2002/0080728 A1 | 6/2002 | Sugar et al. | |
| 2003/0020521 A1 | 1/2003 | Lee et al. | |
| 2003/0160714 A1 * | 8/2003 | Yoshinaga | 341/122 |
| 2006/0045224 A1 * | 3/2006 | Cranford et al. | 375/355 |

FOREIGN PATENT DOCUMENTS

| | | |
|---|---|---|
| EP | 0447302 B1 | 9/1991 |
| EP | 00463621 A1 | 1/2000 |
| EP | 00463621 B1 | 1/2000 |
| EP | 1 058 387 | 12/2000 |

OTHER PUBLICATIONS

Johnston, Jerome, "Switched-Capacitor A/D Converter Input Structures," Crystal Semiconductor Corp., htt://www.crystal.com, Jan. 1995, pp. 1-6.

U.S. Appl. No. 10/426,042, filed Apr. 29, 2003, Sooch et al.

Foreign Search Report and Written Opinion PCT/US2006/011698, mailed Jul. 27, 2006.

International Search Report & Written Opinion; PCT/US2006/011698; Mailed Jul. 27, 2006.

* cited by examiner

METHOD AND SYSTEM FOR SAMPLING A SIGNAL

BACKGROUND OF THE INVENTION

1. Field of the Invention

This invention relates generally to analog to digital conversion and digital to analog conversion and, more particularly, to converting analog signals to digital representations in the presence of digital noise.

2. Description of the Related Art

High performance wireless communication apparatus such as RF receivers, transmitters, and transceivers typically include RF front-end circuitry that operates on an RF signal being received or transmitted. For example, the front-end circuitry may down-convert a received RF signal to baseband and/or up-convert a baseband signal for RF transmission. The RF front-end circuitry typically includes analog circuits such as low noise amplifiers and mixers that have a relatively high sensitivity to noise and interference. The RF circuitry in some applications, such as in mobile communication cellular handsets, may be required to detect signals as small as a few micro-volts or less in amplitude. It is thus often important to minimize noise and interference from sources external or even internal to the communication apparatus.

In addition to the RF front-end circuitry, typical wireless communication apparatus may also include digital processing circuitry that performs various digital functions. The digital processing circuitry may include a variety of specific hardware such as a DSP (digital signal processor), an MCU (microcontroller unit), hardware accelerators, memory, and/or I/O interfaces, among numerous other specific hardware devices.

Unfortunately, the digital processing circuitry of a typical communication apparatus can be a significant source of detrimental noise and interference. More particularly, the digital processing circuitry in a typical high performance communication apparatus produces digital signals with relatively small rise and fall times, or with fast transitions or sharp edges. Furthermore, those signals often have relatively high frequencies. As a result, they generate high frequency interference. These spurious emissions may interfere with, and may adversely impact, the performance of the RF front-end circuitry. Thus, in many systems, the RF front-end circuitry is implemented on an integrated circuit die that is separate from the integrated circuit die on which the digital processing circuitry is implemented.

For various reasons, it may be desirable to integrate the RF front-end circuitry and digital processing circuitry on a single integrated circuit die. However in certain implementations, integration of the RF front-end circuitry and digital processing circuitry on a single integrated circuit may present challenges due to digital noise from the digital processing circuitry.

SUMMARY

Various embodiments of a system including a sampling circuit for sampling a signal are disclosed. In one embodiment, a system such as a mobile phone, for example, includes a digital circuit that may be clocked by a digital clock signal having an associated clock period. The system also includes a sample clock generation circuit coupled to a sampling circuit. The sample clock generation circuit may be configured to receive an input clock having a fixed phase relationship with respect to the digital clock signal. The sample clock generation circuit may also generate a sample clock having a first sampling edge corresponding to a first relative offset within the clock period and a subsequent sampling edge corresponding to a different relative offset within the clock period. The sampling circuit may be configured to sample a designated signal upon a first sampling instance corresponding to the first sampling edge and to sample the designated signal upon a subsequent sampling instance corresponding to the subsequent sampling edge.

In another embodiment, the system includes a digital circuit clocked by a digital clock signal having an associated clock period. The system also includes a sample clock generation circuit coupled to a sampling circuit. The sample clock generation circuit may be configured to receive an input clock having a fixed phase relationship with respect to the digital clock signal. The sample clock generation circuit may further generate a plurality of sample clock signals each having a sampling edge corresponding to a different relative offset within the clock period. In addition, the sampling circuit may be configured to sample a designated signal in response to each of the sampling edges during sample cycle.

Figure 1:
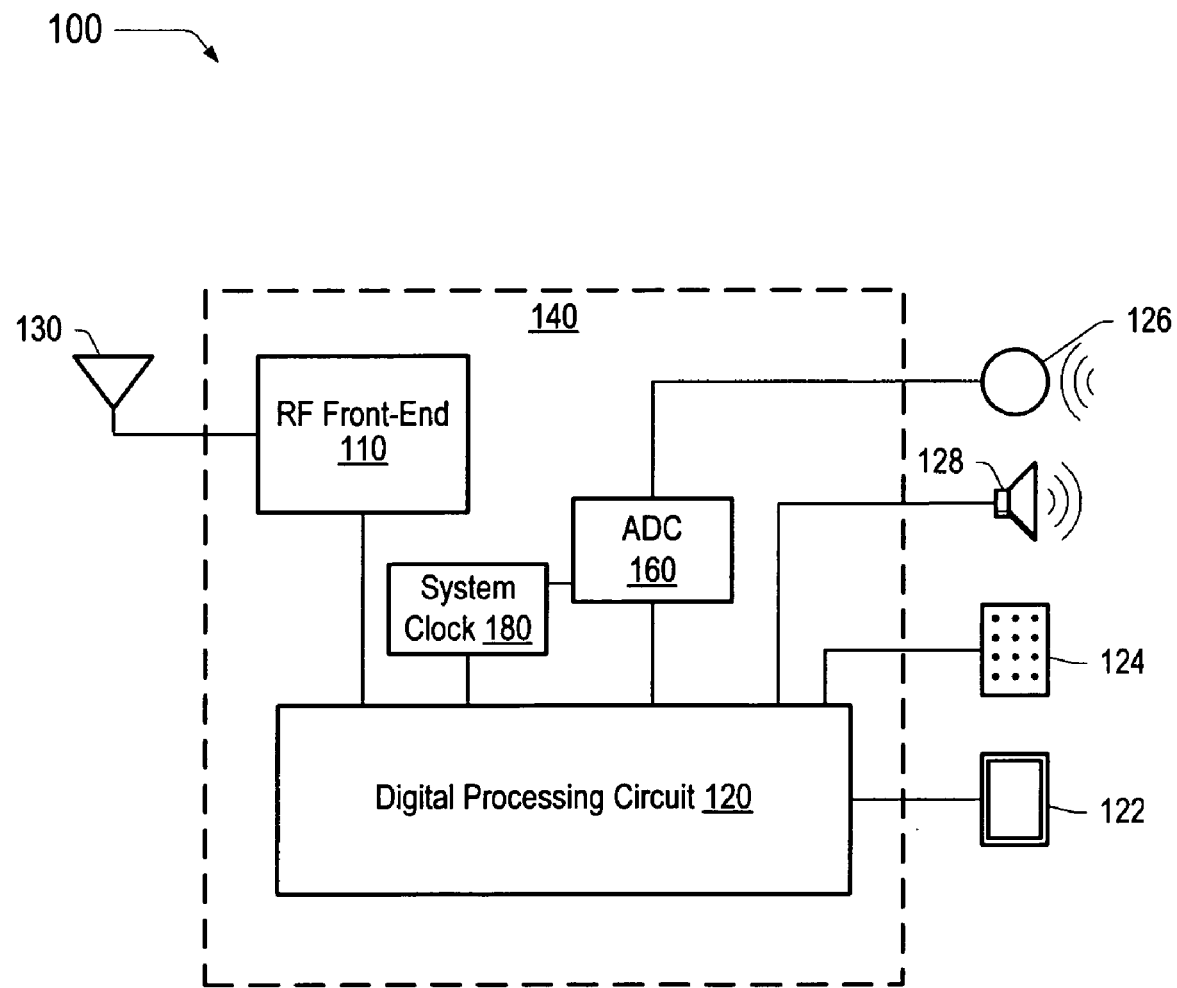
FIG. 1 illustrates a generalized block diagram of a communication apparatus including an RF front-end circuit and a digital processing circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include" and derivations thereof mean "including, but not limited to." The term "connected" means "directly or indirectly connected," and the term "coupled" means "directly or indirectly coupled."

DETAILED DESCRIPTION

Turning now to FIG. 1, a generalized block diagram of a communication apparatus 100 including an RF front-end circuit 110 coupled to a digital processing circuit 120 is shown. As illustrated, various user interfaces including a display 122, a keypad 124, a microphone 126, and a speaker 128 may be coupled to digital processing circuit 120, depending upon the specific application of communication apparatus 100 and its desired functionality. An antenna 130 is also shown coupled to RF front-end circuit 110.

Communication apparatus 100 is illustrative of various wireless devices including, for example, mobile and cellular phone handsets, machine-to-machine (M2M) communication networks (e.g., wireless communications for vending machines), so-called "911 phones" (a mobile handset configured for calling the 911 emergency response service), as well as devices employed in emerging applications such as 3G, satellite communications, and the like. As such, communication apparatus 100 may provide RF reception functionality, RF transmission functionality, or both (i.e., RF transceiver functionality).

Communication apparatus 100 may be configured to implement one or more specific communication protocols or standards, as desired. For example, in various embodiments communication apparatus 100 may implement the Global System for Mobile Communications (GSM) standard, the Personal Communications Service (PCS) standard, the Digital Cellular System (DCS) standard, the General Packet Radio Service (GPRS) standard, and/or the Enhanced General Packet Radio Service standard (E-GPRS), which may also be referred to as the Enhanced Data for GSM Evolution (EDGE) standard, among others.

RF front-end circuit 110 may accordingly include circuitry to provide the RF reception capability and/or RF transmission capability. In one embodiment, front-end circuit 110 may down-convert a received RF signal to baseband and/or up-convert a baseband signal for RF transmission. RF front-end circuit 110 may employ any of a variety of architectures and circuit configurations, such as, for example, low-IF receiver circuitry, direct-conversion receiver circuitry, direct up-conversion transmitter circuitry, and/or offset-phase locked loop (OPLL) transmitter circuitry, as desired. RF front-end circuit 110 may additionally employ a low noise amplifier (LNA) for amplifying an RF signal received at antenna 130 and/or a power amplifier for amplifying a signal to be transmitted from antenna 130. In alternative embodiments, the power amplifier may be provided external to RF front-end circuit 110.

Digital processing circuit 120 may provide a variety of signal processing functions, as desired, including baseband functionality. For example, digital processing circuit 120 may be configured to perform filtering, decimation, modulation, demodulation, coding, decoding, correlation and/or signal scaling. In addition, digital processing circuit 120 may perform other digital processing functions, such as implementation of the communication protocol stack, control of audio testing, and/or control of user I/O operations and applications. To perform such functionality, digital processing circuit 120 may include various specific circuitry, such as a software programmable MCU and/or DSP, as well as a variety of specific peripheral circuits such as memory controllers, direct memory access (DMA) controllers, hardware accelerators, digital audio interfaces (DAI), and user interface circuitry (all not shown). The choice of digital processing hardware (and firmware/software, if included) depends on the design and performance specifications for a given desired implementation, and may vary from embodiment to embodiment.

As shown, communication apparatus 100 also includes a system clock 180 and an analog-to-digital converter (ADC) 160. In one embodiment, system clock 180 is coupled to provide a reference clock to digital processing circuit 120 and to ADC 160. ADC 160 is configured to convert analog signals into digital representations of those signals that may be further processed by digital processing circuit 120. For example, in the illustrated embodiment, microphone 126 may convert voice or other sounds into analog signals that are provided to ADC 160. ADC 160 may convert those analog signals into digital representations or digital signals. The digital representations may be processed and/or stored within digital processing circuit 120. For example, depending on the specific implementation, the digital representations may be encoded or compressed using any of various compression algorithms in preparation of transmission by RF front end 110. In various embodiments, ADC 160 may be implemented as any type of analog-to-digital converter such as, for example, a delta-sigma converter.

Figure 2:
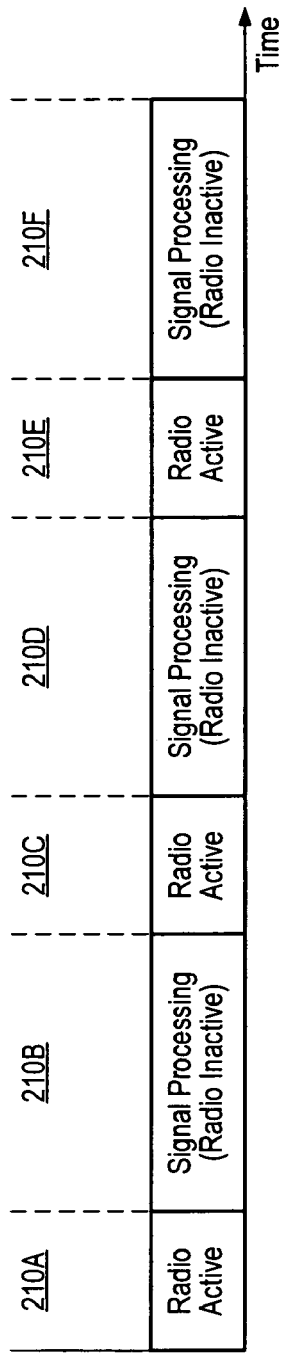
FIG. 2 illustrates a set of events that occur in a communication apparatus according to one embodiment of a time domain isolation.

In one embodiment, RF front-end circuit 110, digital processing circuit 120, and ADC 160 may be integrated on the same integrated circuit die 140. To reduce interference between the RF front-end circuit 11 and the digital processing circuit 120 and thus accommodate high performance functionality, communication apparatus 100 may implement a technique referred to as time domain isolation, or TDI. FIG. 2 illustrates a set of events that occur in communication apparatus 100 according to time domain isolation. Broadly speaking, two alternative events take place in such a system: RF reception or transmission, and signal processing. The system arranges in time the RF reception or transmission activities and the signal processing activities so as to avoid or reduce interference between the RF front-end circuit 110 and digital processing circuit 120. To ensure that no external audio is lost, ADC 160 may continue to convert audio signals regardless of whether the system is performing signal processing activities or RF reception or transmission activities.

As shown in FIG. 2, communication apparatus 100 employs a plurality of timeslots 210A–210F, and so on. During RF timeslots 210A, 210C, and 210E, RF front-end circuit 110 may receive RF signals, process the received signals, and store the results. Subsequently, during signal processing timeslots 210B, 210D, and 210F, respectively, digital processing circuit 120 may perform signal-processing tasks on the stored results.

Alternatively, during RF timeslots 210A, 210C, and 210E, RF front-end circuit 110 may transmit RF signals. Thus, in this mode of operation, during signal processing timeslots 210B and 210D, digital processing circuit 120 perform signal processing tasks on input data (e.g., voice, data), and store the results. Subsequently, during RF timeslots 210C and 210E, respectively, RF front-end circuit 110 may perform RF operations on the stored results (for example, up-conversion) and transmit an RF signal.

It is noted that, depending on the specific protocol, architecture, and circuitry used, communication apparatus may receive and transmit simultaneously, as desired. More commonly, however, the system either transmits signals or receives signals during any one of RF time-slots 210A, 210C, 210E, etc. For example, a GSM-compliant system or apparatus, such as a mobile telephone that complies with the GSM specifications, either receives or transmits RF signals in one or more bursts of activity during each of RF time-slots 210A, 210C, 210E, etc.

It is further noted that the RF time-slots may have the same or different durations, as desired. RF time-slots may have unequal lengths so as to accommodate a wide variety of circuitry, systems, protocols, and specifications, as desired.

Similarly, the signal-processing time-slots may have similar or dissimilar durations, as desired. Each of signal-processing time-slots 210B, 210D, 210F, etc. may include several other time-slots or time divisions, depending on the particular communication protocol and/or signal-processing techniques and the particular circuitry and technology used. For example, a signal-processing time-slot may include several time-slots, with a portion or a particular circuit of digital processing circuit 120 actively processing signals during one or more of the time-slots.

To implement time domain isolation, digital processing circuit 120 may be placed in a shutdown mode of operation when an RF timeslot commences (i.e., when the radio is active). In one embodiment, during the shutdown mode of operation, a clock signal or signals within digital processing circuit 120 are disabled or inhibited. More specifically, by using static metal oxide semiconductor (MOS) circuitry, for example, the clock signal or signals within digital processing circuit 120 may be shut down without losing data present within that circuitry. Accordingly, digital processing circuit 120 can preserve the data within it while the RF front-end circuit 110 is active. Once the RF front-end circuit 110 has completed its reception or transmission (e.g., an RF timeslot has ended), the shutdown mode of digital processing circuit 120 may be discontinued by re-enabling the clock signal or signals. Digital processing operations on the data may then continue or commence. By disabling the clock or clocks in digital processing circuit 120 while RF front-end circuit 110 is active (i.e., receiving or transmitting), the amount of digital noise and thus spurious signals at the RF band of interest may be reduced, thus accommodating high performance.

It is noted that although FIG. 2 depicts the operation of the RF front-end circuit 110 and the signal processing operations as alternative events, these operations need not be mutually exclusive. Generally, it may be desirable to reduce or minimize the amount of overlap between the operation of the RF front-end circuit 110 and the signal processing operations. Depending on a number of factors, however, the active operation of RF front-end circuit 110 and signal processing operations of digital processing circuit 120 may overlap to a certain extent.

It is also noted that in some alternative embodiments, the shutdown mode of digital processing circuit 120 may be implemented by causing at least portions of the circuitry to be held inactive or to be otherwise inhibited using other techniques (i.e., other than by disabling a clock signal(s)). For example, power may be removed from particular circuitry within digital processing circuit 120. Likewise, flip-flops or other circuits may be disabled (e.g., through an enable input). In addition, it is noted that some portions of the digital processing circuit 120, such as dynamic memory and flow control logic, may remain active during the shutdown mode (i.e., the circuitry of digital processing circuitry 120 may be partially powered down, disabled, or inhibited during the shutdown mode).

As mentioned above, ADC 160 may also sample the external audio during both active and inactive modes of digital processing circuit 120. Thus, although TDI may reduce interference between the RF front-end circuit 110 and portions of the digital processing circuit 120, an artifact of using TDI may present a challenge to sampling the external audio signals with ADC 160.

Figure 3:
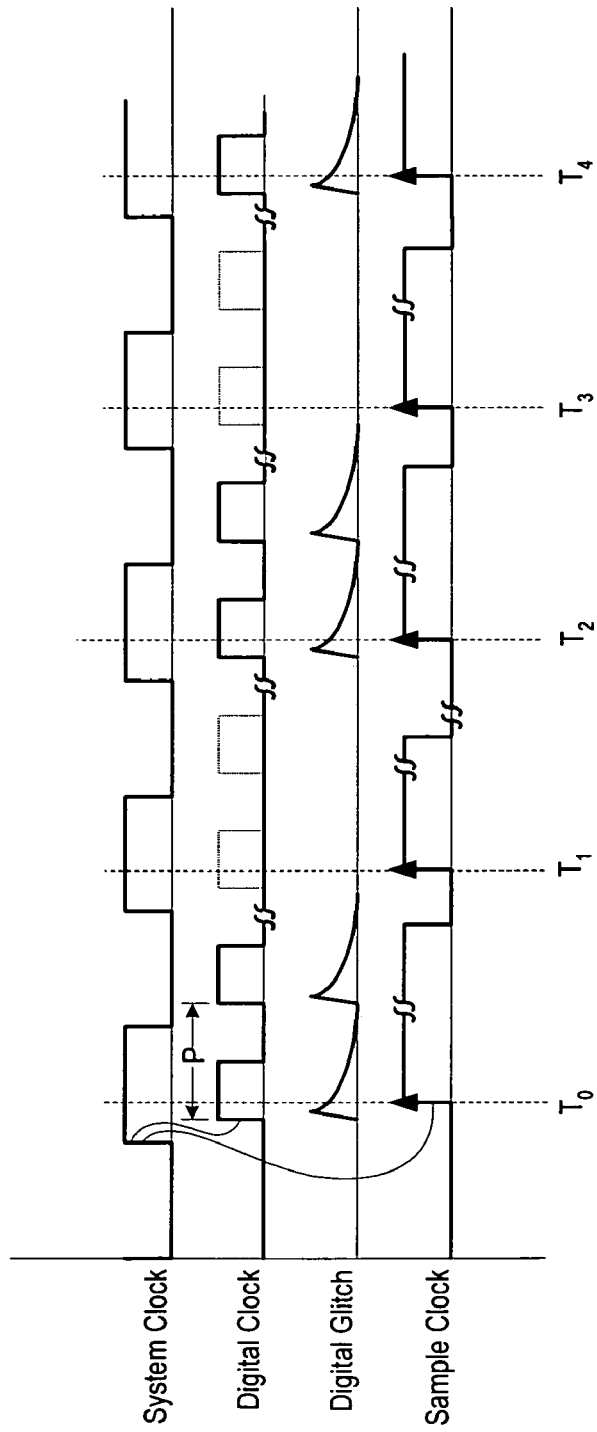
FIG. 3 is a timing diagram illustrating various signals associated with one embodiment the communication apparatus of FIG. 1.

More particularly, as illustrated in FIG. 3, depending on when ADC 160 samples the external audio signal with respect to the period of the digital clock signal, the noise and interference produced during the switching of the digital circuits within digital processing circuit 120 may be coupled into the audio samples. In one embodiment, the switching noise may be coupled into the samples via "sneak paths" created by parasitic capacitances between the substrate of the integrated circuit 140 and the input paths of ADC 160.

FIG. 3 illustrates a timing diagram that depicts various signals associated with one embodiment of communication apparatus 100. The timing diagram shows a system clock signal, a digital clock signal, digital noise (glitch), and a sample clock. Referring collectively to FIG. 1 through FIG. 3, the system clock signal may be provided by system clock 180. As shown by the curved lines, the system clock signal may be used to derive a sample clock signal of a desired frequency to control the timing of sampling cycles associated with ADC 160. The system clock signal may also be used to derive a digital clock signal for clocking digital processing circuit 120. As such, the digital clock signal and the sample clock may have a fixed phase relationship with one another.

As shown, the digital clock signal is broken into segments to illustrate that the digital clock may be operating at a much higher frequency than the system clock. The dashed lines in the digital clock signal are indicative of cycles in which the digital processing circuit 120 is in the inactive mode due to TDI, as described above. In one embodiment, the digital processing circuit may be enabled and disabled at a rate that may be referred to as the frame rate. The frame rate may depend on which communication standard is being used (e.g., GSM, PCS, etc.).

In the illustrated embodiment, upon each rising edge of the digital clock signal (in cycles that the digital processing circuit 120 is active) a glitch is produced and the corresponding digital noise may be coupled through the substrate to ADC 160. As shown, the glitch may have a profile such that its peak occurs in the early portion of the digital clock period and it may decay throughout the digital clock period until the next rising edge of the digital clock. Depending on where the sample clock edge occurs, this digital noise may be captured in the analog sample. It is noted that depending upon various parameters such as temperature, for example, the peak of the glitch may take longer to decay (e.g., 2/3P).

In the illustrated embodiment, during each cycle of the sample clock, ADC 160 may sample the input signal on the sample clock edge, as depicted by the arrows on the rising edges of the sample clock signal. Since the phase relationship between the sample edge and the digital clock may be fixed for a given set of operating and process parameters, the sample clock edge may "land" anywhere within a given digital clock period. As such, during each sample cycle the digital glitch may be sampled at its peak or at its trough or anywhere in between.

In the example shown in FIG. 3, the sample edges of the sample clock occur early in the period of the digital clock (i.e., before the glitch has had time to appreciably decay). The first sample edge occurs at time $T_0$, the second sample edge occurs at time $T_1$, the third sample edge occurs at time $T_2$ and so on. However at times $T_1$ and $T_3$, the digital processing circuit 120 is inactive and thus there is no digital glitch noise to sample. This cycling of the digital processing circuit 120 may cause the digital glitch noise to be present in some samples and not others. Accordingly, in the frequency domain, the noise may appear as a tone with a particular amplitude at the frame frequency. The magnitude of the tone may depend upon the phase relationship between the sample clock and the digital clock (i.e., where the sample edge occurs relative to the digital clock period). It is noted that if the glitch noise were present in every sample (as it might be if digital processing circuit 120 were active during all samples), the noise may not present a significant issue since it may appear as a DC offset in the frequency spectrum.

Figure 4:
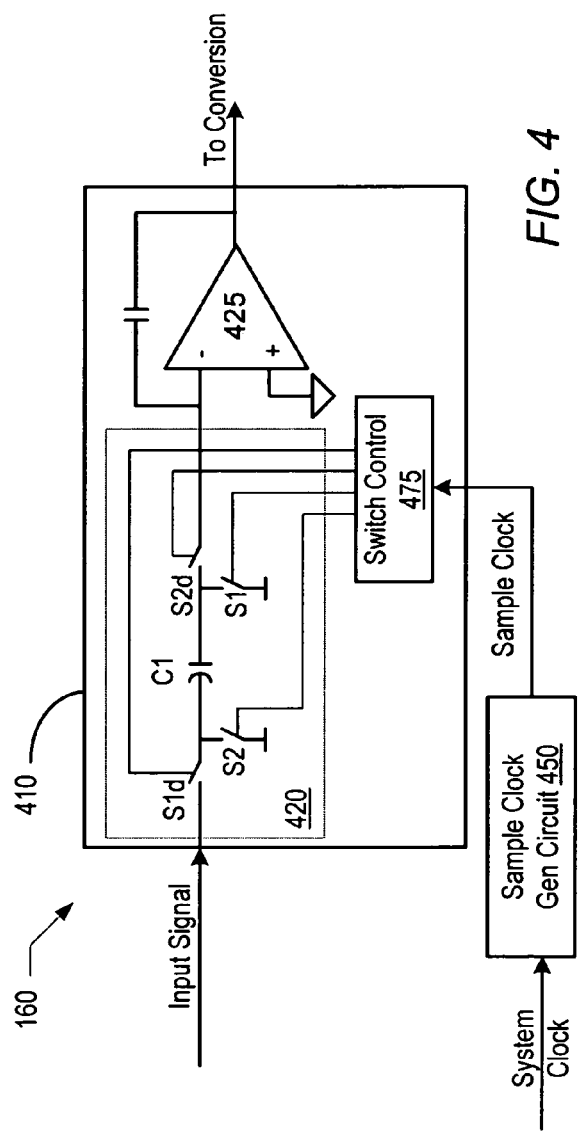
FIG. 4 illustrates a block diagram of portions of one embodiment of an analog-to-digital converter including a sampling circuit and a sample clock generation circuit.

Referring to FIG. 4, a block diagram of one embodiment of the analog-to-digital converter 160 of FIG. 1 is shown. ADC 160 includes a sampling circuit 410 coupled to receive an input signal, such as an input analog audio signal, for example. Sampling circuit 410 is also coupled to receive a sample clock from a sample clock generation circuit 450 and to provide an output to other portions of ADC 160 (not shown for simplicity). For example, in embodiments where ADC 160 is implemented as a delta-sigma converter, the output of sampling circuit 410 may be provided to a comparator (not shown), which may output a binary bit stream in which the density of bits in the stream represents the analog input signal. The bit stream may be provided to a decimation filter (not shown) that produces a multi-bit binary value representing the analog input signal.

As shown, sampling circuit 410 includes a sample and hold circuit 420 which includes sampling capacitor C1 and switches S1, S1$d$, S2, and S2$d$ coupled to an integrator 425. In addition, sampling circuit 410 includes a switch control unit 475 that is coupled to provide clock signals for switches S1, S1$d$, S2, and S2$d$ based upon the sample clock.

Sampling circuit 410 may be configured to sample the input signal in response to each sampling edge of the sample clock and to provide the samples for conversion. More particularly, upon each rising edge of the sample clock, switch control unit 475 may be configured to generate a plurality of clock signals to cause the switches within switched capacitor circuit to switch.

As shown, the switches S1, S1$d$, S2, and S2$d$ may be configured to open and close according to their respective clock signals to allow the sampling capacitor C1 to charge based upon the input signal and to transfer the stored charge to the integrator 425. In one embodiment, switch control 475 may generate the switch clock signals such that the switches open and close in the following sequence: S1 close, S1$d$ close, S1 open, S1$d$ open, S2 close, S2$d$ close, S2 open, S2 open. This sequence corresponds to a sampling instance, which may be generated based upon the rising edge of the sample clock. It is noted that switches S1, S1$d$, S2, and S2$d$ may be implemented using one or more transistors.

In the illustrated embodiment, integrator 425 may provide an output signal based upon the input signal samples. The output of integrator 425 may be used in subsequent stages of analog-to-digital conversion of the input signal. It is noted that although the diagram shows a single ended input to the integrator, it is contemplated that in other embodiments, the input signal path may use differential signaling.

Figure 5:
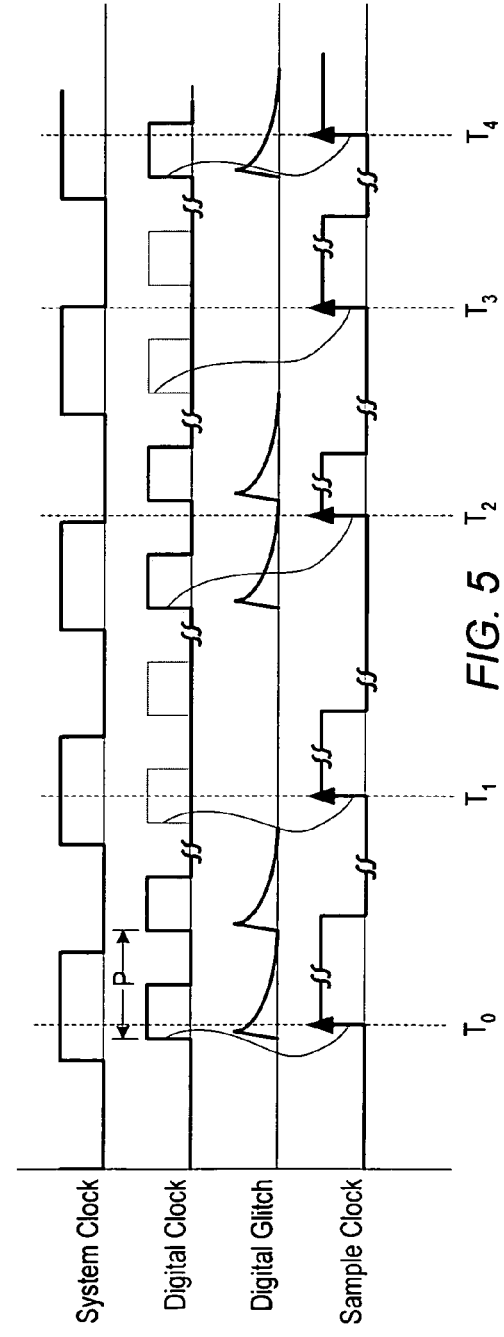
FIG. 5 is a timing diagram illustrating various signals associated with the embodiment of the analog-to-digital converter shown in FIG. 4.

Sample clock generation circuit 450 may be configured to generate the sample clock based upon a received system clock signal such as the system clock signal provided by system clock 180, for example. As shown in FIG. 5, sample clock generation circuit 450 may be configured to generate a sample clock in which the sample edge may occur at a different relative offset within the clock period of the digital clock upon different sampling instances.

FIG. 5 is a timing diagram illustrating various signals associated with the embodiment of the analog-to-digital converter of FIG. 4. The timing diagram shown in FIG. 5 is similar to the timing diagram shown in FIG. 3. However in contrast to the sample clock timing illustrated in FIG. 3, each of the illustrated sample clock edges in FIG. 5 occurs at a different time relative to the period of the digital clock signal.

More particularly, the first sampling edge of the sample clock occurs at time $T_0$. The second sampling edge of the sample clock occurs at time $T_1$, which occurs at a relative offset within the period of the digital clock that is different than the sampling edge at $T_0$. Similarly, the third sampling edge of the sample clock occurs at time $T_2$, which is a different relative offset within the period of the digital clock than the sampling edges at $T_0$ and $T_1$. The fourth sampling edge of the sample clock occurs at time $T_3$, which is at a different relative offset within the period of the digital clock than the sampling edges at $T_0$–$T_3$. Likewise, the fifth sampling edge at time $T_4$ occurs at a different relative offset within the period of the digital clock than the sampling edges at $T_0$–$T_4$.

Similar to the timing shown in FIG. 3, at times $T_1$ and $T_3$, the digital processing circuit 120 is inactive and thus there is no digital glitch noise to sample. Accordingly, the digital glitch noise may be sampled during some samples and not others. However, as shown, at times $T_0$, $T_2$ and $T_4$ of FIG. 5, since the sample edges occur at different relative offsets within the period of the digital clock, the noise component in each sample may be different.

Thus, by sampling the input signal as shown in FIG. 5, it may be possible to reduce the effects of the glitch noise by averaging the glitch noise over time. Specifically, instead of a tone, the glitch noise may appear as an elevated noise floor in the frequency spectrum. As described in greater detail in conjunction with the description of FIG. 6 below, in one embodiment, the sampling edge used during each sample cycle may be selected pseudo-randomly, thereby causing the glitch noise to be spread across the sample frequency bandwidth. However, it is noted that in other embodiments, the sample clock may be generated differently. For example, in alternative embodiments, an analog noise source may be used to generate a sample clock in which the sample edges occur at different relative offsets within the period of the digital clock.

Figure 6:
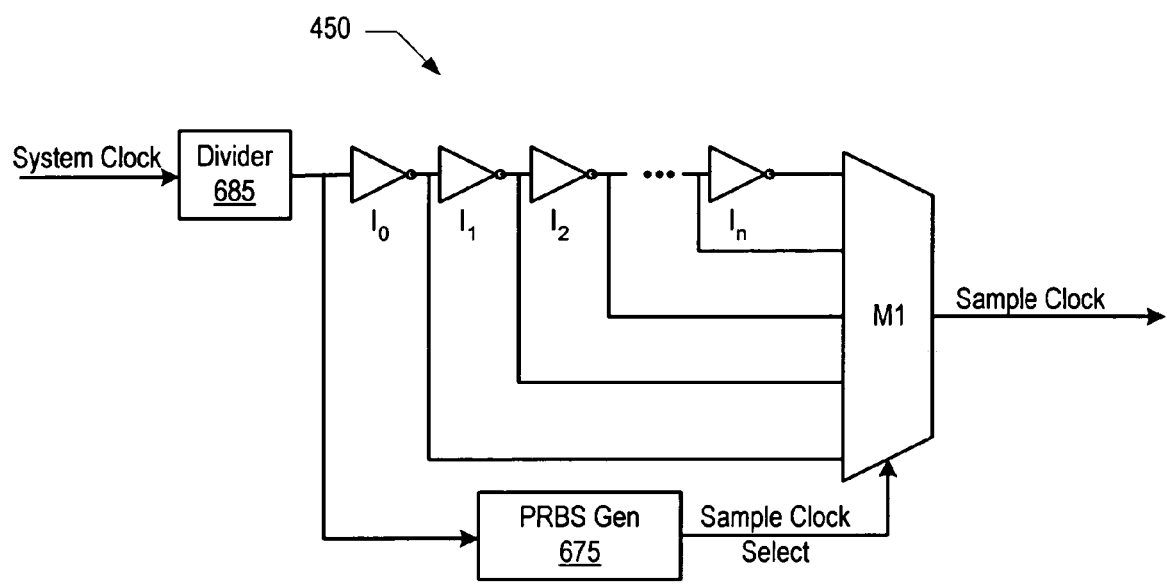
FIG. 6 is a block diagram of one embodiment of the sample clock generation circuit shown in FIG. 4.

FIG. 6 illustrates a block diagram of an embodiment of the sample clock generation circuit 450 shown in FIG. 4. Sample clock generation circuit 450 of FIG. 6 includes a clock divider 685 that is coupled to a chain of inverters designated $I_0$ through $I_n$. The output of each inverter is coupled to a multiplexer M1. The output of divider 685 is also coupled to a pseudo-random bit sequence (PRBS) generator 675. The output of PRBS generator 675 is coupled to the input selector of multiplexer M1. It is noted that in other embodiments, divider 685 may be part of system clock 180.

In the illustrated embodiment, the output of divider 685 may be coupled to both the PRBS generator 675 and also the inverter chain. In one embodiment, the output of divider 685 may be a 1 MHz clock (although other frequencies are possible), thus creating a 1-microsecond sample period. The output of each inverter is a delayed version of the 1 MHz clock in which each inverter may add a gate delay to the clock edge. Although process and technology dependent, in one embodiment, each delay may be a five hundred picosecond delay. The output of each inverter is an input to multiplexer M1. During each clock cycle of the 1 MHz clock, PRBS generator 675 may pseudo-randomly generate a binary sequence that is used to select one of the inputs to multiplexer M1. Accordingly, each sample clock cycle, sample clock generation circuit 450 may produce a sample clock in which the sampling edge has a different delay, effectively creating a jittered sample clock. Thus, as shown in FIG. 5, each sampling edge may have a different relative offset within the digital clock period in which a sample is taken.

Figure 7:
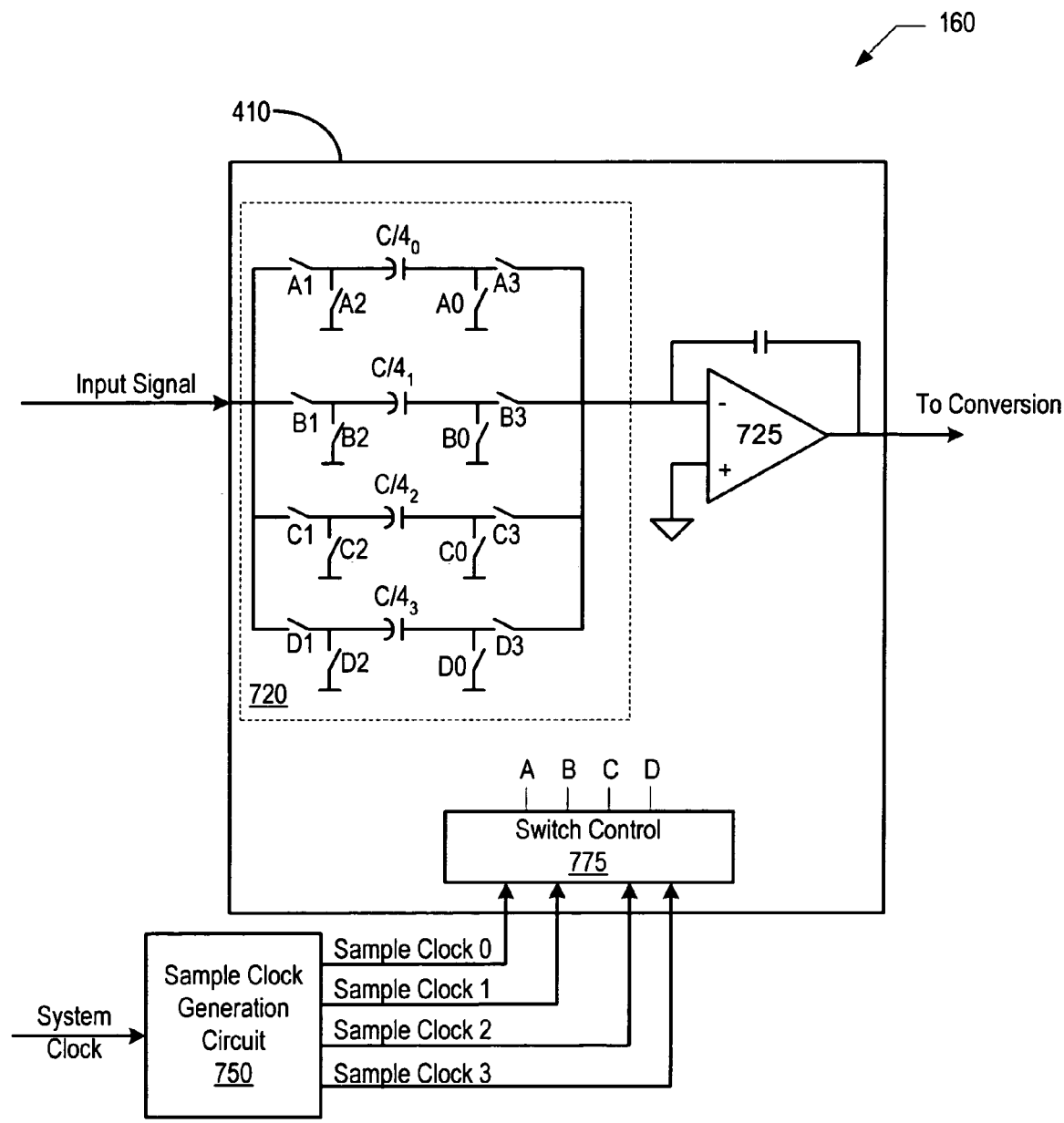
FIG. 7 illustrates a block diagram of portions of another embodiment of an analog-to-digital converter including a sampling circuit and a sample clock generation circuit.

Turning to FIG. 7, a block diagram of another embodiment of analog-to-digital converter 160 is shown. ADC 160 of FIG. 7 includes a sampling circuit 410 coupled to receive an input signal, such as an input analog audio signal, for example. Sampling circuit 410 is also coupled to receive four sample clocks designated 0–3 from a sample clock generation circuit 450 and to provide an output to other portions of ADC 160 (not shown for simplicity).

As shown in FIG. 7, sampling circuit 410 of FIG. 7 includes a sample and hold circuit 720, which includes four sample and hold sub-circuits, an integrator 725 and a switch control unit 775. Each sample and hold sub-circuit includes a sampling capacitor and an associated switch set. The first sample and hold sub-circuit includes sampling capacitor $C/4_0$ and switches A0, A1, A2, and A3. The second sample and hold sub-circuit includes sampling capacitor $C/4_2$ and switches B0, B1, B2, and B3 and so on for the third and fourth sample and hold sub-circuits.

In addition, sampling circuit 410 includes a switch control unit 475 that is coupled to provide clock signal groups A, B, C, and D to the switch sets based upon the four sample clocks 0, 1, 2 and 3, respectively. It is noted that each sampling capacitor in FIG. 7 may be matched to have substantially the same capacitance value. In one embodiment, the capacitance value is one fourth of the value of the capacitance of a single sampling capacitor such as capacitor C1 of FIG. 4, for example.

Sampling circuit 410 may be configured to sample the input signal each sample cycle in response to the sampling edges of the sample clocks 0–3 and to provide the samples for conversion. More particularly, upon the rising edges of sample clocks 0–3, switch control unit 475 may be configured to generate a plurality of clock signals to cause the switches within switched capacitor circuit 720 to switch.

As shown, the switches A0, A, A2, and A3 may be configured to open and close according to their respective clock signals to allow the sampling capacitor $C/4_0$ to charge based upon the input signal and to transfer the stored charge to the integrator 725. In one embodiment, switch control unit 775 may generate the 'A' switch clock signals such that the 'A' switches open and close in the following sequence: A0 close, A1 close, A0 open, A1 open, A2 close, A3 close, A2 open, A3 open. This sequence corresponds to a sampling instance, which may be generated based upon the sampling edge of sample clock 0. It is noted that switches A0, A1, A2, and A3 may be implemented using one or more transistors. The switches in the remaining sub-circuits may be operated similarly using the 'B', 'C', and 'D' switch clock signals to allow their respective sampling capacitors to charge based upon the input signal and to transfer the stored charge to the integrator 725. In one embodiment, switch control unit 775 may generate the clock signals for switches A3, B3, C3, and D3 such that the charge is transferred from all sampling capacitors to the input of integrator 725 at substantially the same time.

In the illustrated embodiment, integrator 725 may provide an output signal based upon the input signal sampled by the switched capacitor sub-circuits. The output of integrator 725 may be used in subsequent stages of analog-to-digital conversion of the input signal. It is noted that although the diagram shows a single ended input to the integrator, it is contemplated that in other embodiments, the input signal patch may use differential signaling.

Figure 8:
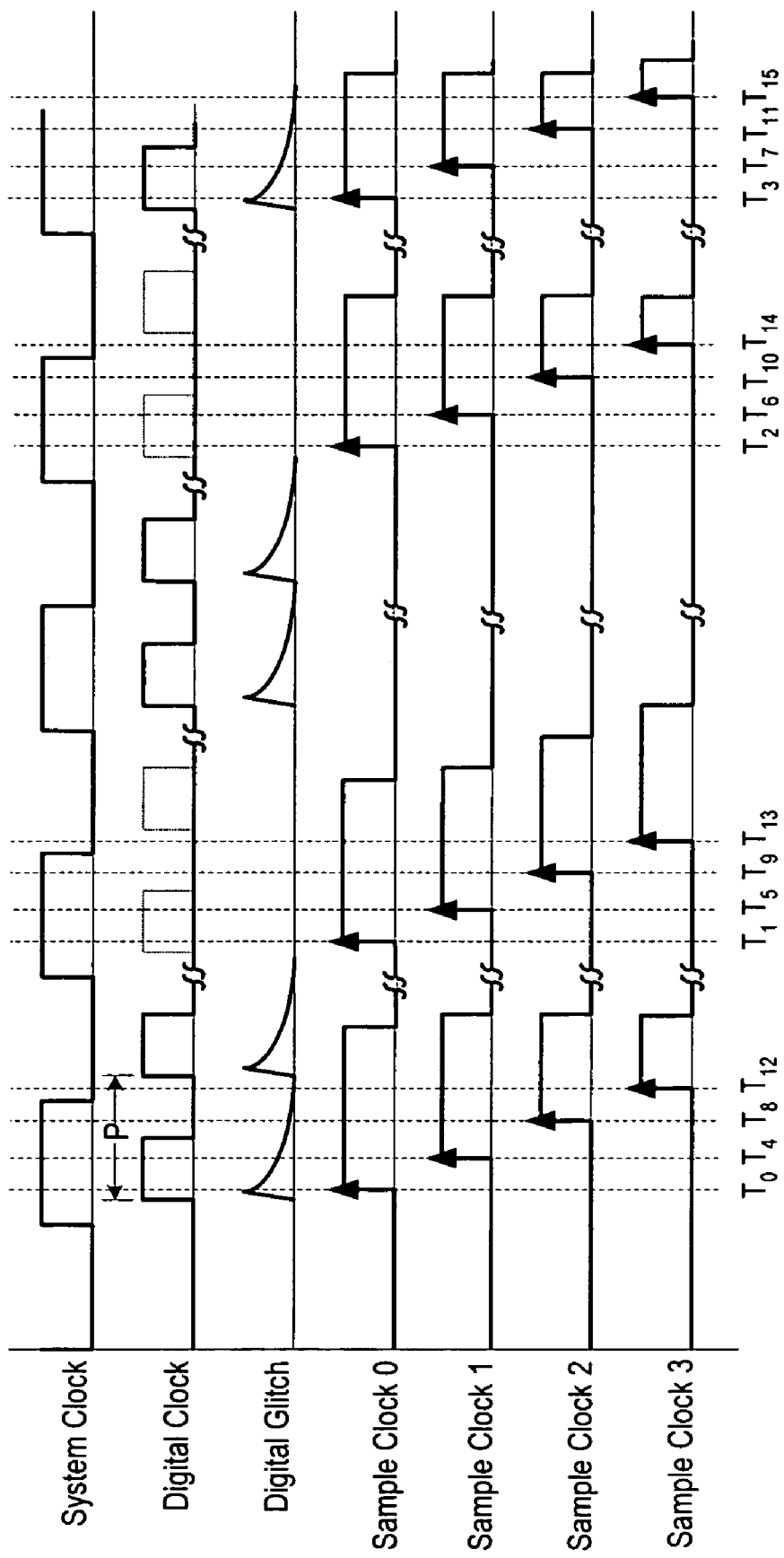
FIG. 8 is a timing diagram illustrating various signals associated with the embodiment of the analog-to-digital converter shown in FIG. 7.

Sample clock generation circuit 450 may be configured to generate sample clocks 0–3 based upon a received system clock signal such as the system clock signal provided by system clock 180, for example. As shown in FIG. 8, sample clock generation circuit 450 may be configured to generate sample clocks 0–3 such that the sample edges may occur at a different relative offset within the clock period of the digital clock during each sample cycle.

It is noted that in other embodiments, other numbers of sample and hold sub-circuits may be used. In such embodiments, other numbers of sampling clocks may be provided by sample clock generation circuit 450. In addition, the capacitance value of each sampling capacitor may be a substantially equal fraction of the capacitance value had a single sample and hold circuit with a single capacitor been used.

FIG. 8 is a timing diagram illustrating various signals associated with the embodiment of the analog-to-digital converter of FIG. 7. The timing diagram shown in FIG. 8 is similar to the timing diagram shown in FIG. 3 with the exception of the sample clock timing. As shown in FIG. 8, there are four sample clocks, designated sample clock 0 through sample clock 3 each with four sampling edges corresponding to four sample cycles.

As described above, during a given sample cycle sample clock generation circuit 450 of FIG. 7 may provide all four sample clocks to sampling circuit 410. Accordingly, as illustrated in FIG. 8, during the first sample cycle sampling edges occur at times $T_0$, $T_4$, $T_8$, and $T_{12}$, during the second sample cycle sampling edges occur at times $T_1$, $T_5$, $T_9$, and $T_{13}$, during the third sample cycle sampling edges occur at times $T_2$, $T_6$, $T_{10}$, and $T_{14}$, and during the fourth sample cycle sampling edges occur at times $T_3$, $T_7$, $T_{11}$, and $T_{15}$. Each of the sample edges corresponds to a sampling instance.

As shown, the sampling edge of each sample clock occurs at the same relative offset within the digital clock period. However, the sampling edge of one sample clock has a different relative offset within the digital clock period than the sampling edge of each other sample clock. Thus, in a given sample cycle sampling circuit 410 may sample the input signal at four different relative offsets within the digital clock period.

It is noted that during sample cycles 2 and 3, the digital processing circuit 120 is inactive and thus there is no digital glitch noise to sample. Accordingly, the digital glitch noise may be sampled during some samples and not others. In addition, as shown, during sample cycles 1 and 4, of FIG. 8, since the four sampling edges of the four sample clocks occur at different relative offsets within the period of the digital clock, the noise component in a sample may be averaged prior to conversion to a digital signal.

By sampling the input signal as shown in FIG. 8, it may be possible to reduce the effects of the glitch noise by averaging the glitch noise during each sample. Specifically, by sampling the input signal at different relative offsets within the digital clock period in a sample cycle, the average/peak glitch noise may be sampled and the magnitude of the glitch noise that appears as a tone may be reduced in the frequency spectrum.

Figure 9:
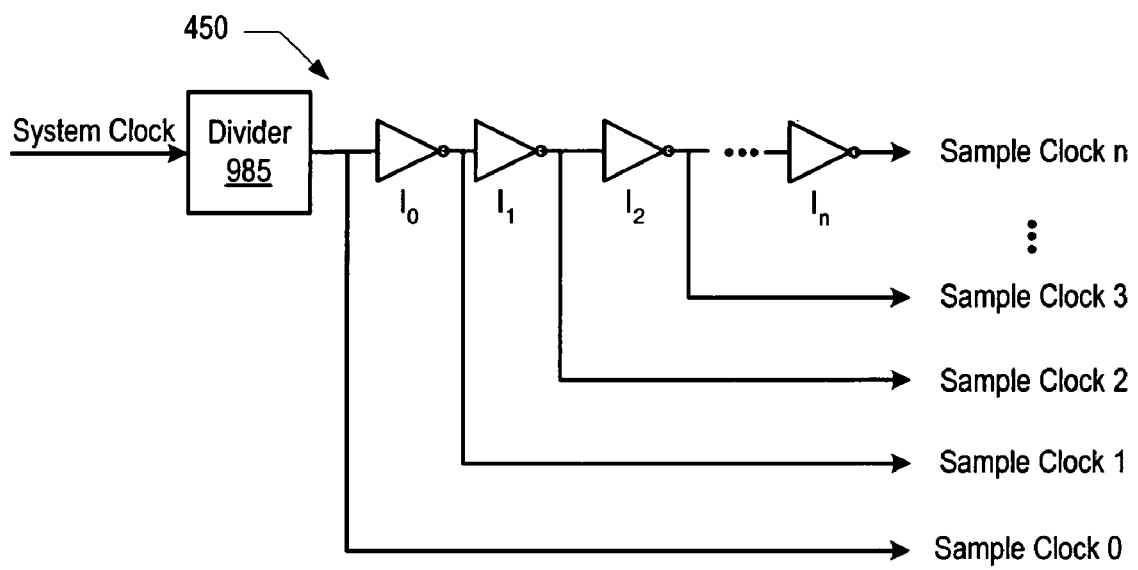
FIG. 9 is a block diagram of one embodiment of the sample clock generation circuit shown in FIG. 7.

Referring to FIG. 9, a block diagram of an embodiment of the sample clock generation circuit 450 of FIG. 7 is shown.

Sample clock generation circuit 450 of FIG. 9 includes a clock divider 985 that is coupled to a chain of inverters designated $I_0$ through $I_n$. The output of each inverter represents a different sample clock designated sample clock 0 through sample clock n, where n may be any number. It is noted that in other embodiments, divider 985 may be part of system clock 180.

In the illustrated embodiment, the output of divider 985 may be coupled to the inverter chain. In one embodiment, the output of divider 685 may be a 1 MHz clock (although other frequencies are possible), thus creating a 1-microsecond sample period. The output of each inverter is a delayed version of the 1 MHz clock in which each inverter may add a gate delay to the clock edge. Although process and technology dependent, in one embodiment, each delay may be a five nanosecond delay. Accordingly, for each sample clock cycle, sample clock generation circuit 450 may produce multiple sample clocks, each of which having a sampling edge with a different delay. As shown in FIG. 8, sample clocks 0 through 3 were used to create four sampling instances each having a different relative offset within the digital clock period.

It is noted that although the embodiments of the sampling circuits and the associated sample clock generation circuits were described in connection with analog-to-digital conversion, in other embodiments, the sampling circuits and the associated sample clock generation circuits may be used in connection with any type of circuit that may employ circuitry to sample analog signals. In addition, the sample and hold circuit configurations described above are specific implementations. It is contemplated that in other embodiments, other specific sample and hold circuit configurations may be implemented as desired.

It is also noted that further reduction in the sampled glitch noise may be achieved by adding polysilicon resistors (not shown) on either side of and in series with the sampling capacitors shown in the embodiments of FIG. 4 and FIG. 7. In addition, other techniques such as linear filtering, deep n well isolation, and matched parasitics in a differential sampling network may also be employed, as desired, to reduce the sneak path coupling of the glitch noise into the samples.

Finally, it is noted that although the positive edges of the sample clocks were used as sampling edges, it is contemplated that in other embodiments, negative edges may be used. Alternatively, in some embodiments, both positive and negative clock edges may be used as desired.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system comprising:
   a digital circuit clocked by a digital clock signal having an associated clock period;
   a sample clock generation circuit configured to receive an input clock having a fixed phase relationship with respect to the digital clock signal, wherein the sample clock generation circuit is configured to generate a sample clock having a first sampling edge corresponding to a first relative offset within the clock period and a next sampling edge corresponding to a different relative offset within the clock period; and
   a sampling circuit coupled to the sample clock generation circuit and configured to sample a designated signal in response to the first sampling edge and to sample the designated signal in response to the next sampling edge.

2. The system as recited in claim 1, wherein the sample clock generation circuit includes a plurality of delay elements, wherein an output of each of the plurality of delay elements is the sample clock having a different delay with respect to the input clock signal, wherein the sampling edge of the sample clock from each output is representative of a time corresponding to a different relative offset within the clock period.

3. The system as recited in claim 2, wherein the clock generation circuit is further configured to pseudo-randomly select a delay element output as the sample clock for each of a plurality of sample cycles.

4. The system as recited in claim 3, wherein the clock generation circuit includes:
   a multiplexer coupled to provide a selected one of the outputs from the plurality of delay elements to the sampling circuit;
   a pseudo-random bit sequence generator coupled to an input selector of the multiplexer for selecting the selected one of the outputs.

5. The system as recited in claim 1, wherein the first sample edge occurs during a first sample cycle and the next sample edge occurs during a next sample cycle.

6. The system as recited in claim 1, wherein the first sampling edge and the next sampling edge are separated in time by at least one-half of the clock period of the digital clock.

7. The system as recited in claim 1, wherein the sampling circuit includes a switched capacitor circuit including a sampling capacitor and a plurality of switches configured to actuate in response to the sample clock for charging the sampling capacitor based upon the designated signal and to transfer the charge from the capacitor for conversion to a digital representation.

8. The system as recited in claim 1, wherein during operation, at least a portion of the digital circuit is configured to be enabled and disabled at a specified frequency and the sampling circuit is configured to sample the designated signal when the digital circuit is both enabled and disabled.

9. A method comprising:
   clocking a digital circuit with a digital clock signal having an associated clock period;
   receiving an input clock having a fixed phase relationship with respect to the digital clock signal;
   generating a sample clock having a first sampling edge corresponding to a first relative offset within the clock period and a next sampling edge corresponding to a different relative offset within the clock period;
   sampling a designated signal in response to the first sampling edge; and
   sampling the designated signal in response to the next sampling edge.

10. The method as recited in claim 9, further comprising generating a plurality of sample clocks each having a different delay with respect to the input clock signal, wherein an output of each of a plurality of delay elements is one of the plurality of sample clocks, wherein the sampling edge of the sample clock from each output is representative of a time corresponding to a different relative offset within the clock period.

11. The method as recited in claim 10, further comprising pseudo-randomly selecting a delay element output as the sample clock for each of a plurality of sample cycles.

12. The method as recited in claim 9, wherein the first sampling edge occurs during a first sample cycle and the next sampling edge occurs during a subsequent sample cycle.

13. The method as recited in claim 9, wherein the first sampling edge and the next sampling edge are separated in time by at least one-half of the clock period of the digital clock.

14. The method as recited in claim 9, further comprising charging a sampling capacitor based upon the designated signal and transferring the charge from the sampling capacitor for conversion to a digital representation by actuating a plurality of switches in response to the sample clock.

15. The method as recited in claim 9, further comprising enabling and disabling at least a portion of the digital circuit at a specified frequency and sampling the designated signal when the digital circuit is both enabled and disabled.

16. A system comprising:
a digital circuit clocked by a digital clock signal having an associated clock period;
a sample clock generation circuit configured to receive an input clock having a fixed phase relationship with respect to the digital clock signal, wherein the sample clock generation circuit is further configured to generate a plurality of sample clock signals each having a sampling edge corresponding to a different relative offset within the clock period; and
a sampling circuit coupled to the sample clock generation circuit and configured to sample a designated signal in response to each of the sampling edges during a sample cycle.

17. The system as recited in claim 16, wherein the clock generation circuit includes a plurality of delay elements, wherein an output of each of the plurality of delay elements is one of the plurality of sample clock signals, wherein each output has a different delay with respect to the input clock signal.

18. The system as recited in claim 16, wherein the sampling circuit includes a plurality of sample and hold circuits each configured to sample the designated signal upon a sampling instance corresponding to a respective one of the sampling edges.

19. The system as recited in claim 18, wherein each of the plurality of sample and hold circuits includes a switched capacitor circuit including a sampling capacitor and a plurality of switches configured to actuate upon a sampling instance for charging the sampling capacitor based upon the designated signal and to transfer the charge from the capacitor for conversion to a digital representation.

20. The system as recited in claim 16, wherein during operation, at least a portion of the digital circuit is configured to be enabled and disabled at a specified frequency and the sampling circuit is configured to sample the designated signal when the digital circuit is both enabled and disabled.

21. A method comprising:
clocking a digital circuit with a digital clock signal having an associated clock period;
receiving an input clock having a fixed phase relationship with respect to the digital clock signal;
generating a plurality of sample clock signals each having a sampling edge corresponding to a different relative offset within the clock period; and
sample a designated signal in response to each of the sampling edges during a sample cycle.

22. The method as recited in claim 21, further comprising generating the plurality of sample clock signals using a plurality of delay elements, wherein an output of each of a plurality of delay elements is one of the plurality of sample clock signals, wherein each output has a different delay with respect to the input clock signal, and wherein the sampling edge of the sample clock from each output is representative of a time corresponding to a different relative offset within the clock period.

23. The method as recited in claim 21, further comprising charging each of a plurality of sampling capacitors based upon the designated signal and transferring the charge from each of the plurality of sampling capacitors for conversion to a digital representation by actuating a respective plurality of switches upon a respective sampling instance.

24. The method as recited in claim 23, wherein transferring the charge from each of the plurality of sampling capacitors occurs at substantially the same time.

25. The method as recited in claim 21, further comprising enabling and disabling at least a portion of the digital circuit at a specified frequency and sampling the designated signal when the digital circuit is both enabled and disabled.

* * * * *